(12) United States Patent
Lin

(10) Patent No.: US 7,450,048 B2
(45) Date of Patent: Nov. 11, 2008

(54) ERROR REDUCING COMPARATOR-BASED SWITCH CAPACITOR CIRCUIT AND METHOD THEREOF

(75) Inventor: Chia-Liang Lin, Union City, CA (US)

(73) Assignee: Realtek Semiconductor Corp., Science Park, HsinChu (TW)

( * ) Notice: Subject to any disclaimer, the term of this patent is extended or adjusted under 35 U.S.C. 154(b) by 132 days.

(21) Appl. No.: 11/551,244

(22) Filed: Oct. 20, 2006

(65) Prior Publication Data

US 2007/0229038 A1    Oct. 4, 2007

Related U.S. Application Data

(63) Continuation-in-part of application No. 11/277,939, filed on Mar. 29, 2006, and a continuation-in-part of application No. 11/277,942, filed on Mar. 29, 2006, now Pat. No. 7,242,331.

(51) Int. Cl.
   *H03M 1/12* (2006.01)
(52) U.S. Cl. .................... 341/155; 341/118; 341/172; 327/157
(58) Field of Classification Search ................ 341/118, 341/155, 172; 327/157
   See application file for complete search history.

(56) References Cited

U.S. PATENT DOCUMENTS

| | | | |
|---|---|---|---|
| 4,400,637 A * | 8/1983 | Klar et al. ............... | 327/336 |
| 5,475,326 A | 12/1995 | Masuda | |
| 5,929,677 A | 7/1999 | Murata | |
| 6,157,322 A | 12/2000 | Anderson | |
| 6,271,784 B1 | 8/2001 | Lynn | |
| 6,525,684 B2 * | 2/2003 | Tsujikawa ................. | 341/155 |
| 6,922,097 B2 | 7/2005 | Chan | |
| 7,023,250 B2 | 4/2006 | Chen | |
| 7,202,718 B2 * | 4/2007 | Lindner et al. .............. | 327/157 |
| 7,242,331 B1 * | 7/2007 | Lin ............................ | 341/118 |
| 7,245,245 B2 * | 7/2007 | Chien .......................... | 341/120 |
| 7,319,425 B2 * | 1/2008 | Fiorenza et al. ............. | 341/172 |
| 2006/0208938 A1 | 9/2006 | Fiorenza | |
| 2007/0035335 A1 | 2/2007 | Lee | |

OTHER PUBLICATIONS

Fiorenza, John K. et al. "Comparator-Based Switched-Capacitor Circuits for Scaled CMOS technologies", IEEE Journal of Solid-State Circuits. vol. 41, No. 12, Dec. 2006, pp. 2658-2668.

Todd Sepke, et al, "Comparator-Based Switched-Capacitor Circuits For Sealed CMOS Technologies.", ISSCC 2006 / Session 12 / NYQUIST ADC's / 12.4, Feb. 7, 2006, pp. 220-221. pp. 649. 2006 IEEE International Solid-State Circuits Conference.

* cited by examiner

*Primary Examiner*—Khai M Nguyen
(74) *Attorney, Agent, or Firm*—Winston Hsu

(57) ABSTRACT

An error reducing comparator based switch capacitor (CBSC) circuit comprises: a comparator of a substantial offset, a charge pump controlled by an output of the comparator, and a plurality of capacitors. The CBSC circuit cyclically operates through a sampling phase, and a transfer phase. During the sampling phase, an input voltage is sampled by a first capacitor. During the transfer phase, the charge stored on the first capacitor is transferred to a second capacitor through injecting or draining charge using the charge pump. The amount of the offset is properly set to reduce an error due to circuit delay of the CBSC circuit.

18 Claims, 3 Drawing Sheets

US 7,450,048 B2

ERROR REDUCING COMPARATOR-BASED SWITCH CAPACITOR CIRCUIT AND METHOD THEREOF

This application is a continuation in part (CIP) of Ser. No. 11/277,939 filed Mar. 29, 2006 and is a CIP of Ser. No. 11/277,942 filed Mar. 29, 2006 now U.S. Pat. No. 7,242,331.

BACKGROUND OF THE INVENTION

1. Field of the Invention

The present invention relates to comparator based switch capacitor circuit, in particular to comparator based switch capacitor circuit that reduces error due to circuit delay.

2. Description of Related Art

Comparator based switch capacitor (CBSC) circuit is an emerging technology that offers many advantages over conventional operational amplifier based switch capacitor circuit. Like a conventional switch capacitor circuit, a CBSC circuit also works in a two-phase manner. The two phases are "sampling" phase and "transfer" phase, controlled by two non-overlapping clocks, say $\phi_1$ and $\phi_2$, respectively. In a typical two-phase CBSC circuit working at a sampling rate of f, the duration of each phase is slightly less than half of the sampling clock period $T=1/f$. During sampling phase ($\phi_1$), an input voltage $V_1$ is sampled using a sampling capacitor $C_1$ by connecting the "+" end of $C_1$ to $V_1$ and the "−" end to a common mode voltage $V_{CM}$. During transfer phase ($\phi_2$), as shown in FIG. 1, the charge stored on the sampling capacitor $C_1$ is transferred to an integrating capacitor $C_2$ via a charge transfer circuit comprising a comparator 130 and a charge pump (CP) 140, which includes a current source $I_1$ and a current sink $I_2$. In FIG. 1, $C_L$ is a load capacitor for the CBSC circuit 100, $V_{DD}$ is a supply voltage, $V_{SS}$ is the lowest potential in the system, and the common mode voltage $V_{CM}$ is usually near the mean value of $V_{DD}$ and $V_{SS}$. Also, $C_L$ is terminated to $V_{CM}$ via a sampling switch 150, which is controlled by a switch signal S. The purpose of the charge transfer circuit is to transfer the charge stored on $C_1$ to $C_2$ until the potentials on the two ends of the comparator 130 are equal, i.e. $V_X=V_{CM}$. The principle of the CBSC circuit 100 during transfer phase ($\phi_2$) is briefly described as follows.

At the beginning of the charge transfer phase, a brief preset (P) must be performed to clear the charge stored on $C_L$ and ensure the voltage $V_X$ is below $V_{CM}$. The preset is done by momentarily pulling the output node $V_O$ to $V_{SS}$, the lowest potential in the system. Next, a coarse charge transfer phase ($E_1$) begins. During coarse charge transfer phase, $V_X<V_{CM}$ and CP 140 turns on the current source $I_1$ to inject charge into the circuit comprising $C_L$, $C_2$, and $C_1$, resulting in a relatively fast voltage ramp on $V_X$ toward $V_{CM}$. CP 140 continues to inject charge until comparator 130 detects $V_X>V_{CM}$. At the instant where comparator 130 detects $V_X>V_{CM}$, a fine charge transfer phase ($E_2$) commences by turning off the current source $I_1$ and turning on the current sink $I_2$ to drain charge from the circuit comprising $C_L$, $C_1$, and $C_2$. One deliberately chooses $I_2$ to be lower than $I_1$, resulting in a relatively slow voltage ramp down on $V_X$ back toward $V_{CM}$. At the instant where the comparator 130 detects $V_X<V_{CM}$ again, the sampling switch 150 is opened and the charge stored on $C_L$ is sampled and frozen.

FIG. 2 depicts a typical timing diagram for the CBSC circuit 100 for the charge transfer phase. Initially the switch signal S is asserted. As a result, the sampling switch 150 is closed and the load $C_L$ is terminated to $V_{CM}$. In the mean while, $V_O$ stays at the sampled level from the previous cycle and $V_X$ is close to $V_{CM}$. The transfer phase $\phi_2$, starting at time $t_1$ and ending at time $t_5$, comprises four sub-phases: preset (P), coarse charge transfer ($E_1$), fine charge transfer ($E_2$), and hold (H). The CBSC circuit 100 first enters the P phase (at time $t_1$), where it pulls the output node $V_O$ to $V_{SS}$ and causes $V_X$ to drop to $V_{XO}$, which is below $V_{CM}$. At time $t_2$, it enters the $E_1$ phase, where comparator detects $V_X<V_{CM}$ and CP 140 injects charge into the circuit comprising $C_L$, $C_2$, and $C_1$, resulting in relatively fast voltage ramp up on both $V_O$ and $V_X$. The $E_2$ phase starts at time $t_3$, the instant where comparator 130 detects $V_X>V_{CM}$. Note that due to circuit delay (i.e. delay from comparator 130 and CP 140), $t_3$ slightly trails the exact time instant where $V_X$ rises past $V_{CM}$. During the $E_2$ phase, CP 140 drains charge from the circuit comprising $C_L$, $C_2$, and $C_1$, resulting in a relatively slow voltage ramp down on both $V_O$ and $V_X$. Finally, the CBSC circuit 100 enters the H phase at time $t_4$, where comparator 130 detects $V_X<V_{CM}$ again. Due to circuit delay, again, $t_4$ slightly trails the exact time instant where $V_X$ falls past $V_{CM}$. During the H phase, S is de-asserted and thus the charge stored on $C_L$ is frozen, and also charge pump circuit CP 140 is disabled.

There is a major problem associated with the prior art CBSC circuit 100 that there is always an error on the final sampled value of $V_O$ due to the circuit delay. As clearly seen in FIG. 2, the actual sampled value is always slightly lower than the ideal sample value, which is the value at the exact time instant where $V_X$ falls past $V_{CM}$.

What is needed is a method to remove the error due to circuit delay for CBSC circuit.

BRIEF SUMMARY OF THIS INVENTION

In an embodiment, an error reducing comparator based switch capacitor (CBSC) circuit is disclosed, the circuit comprising a comparator with a substantial amount of offset, a charge pump controlled by the comparator, and a plurality of capacitors, wherein during a sampling phase the CBSC circuit samples an input voltage using a first capacitor, and during a transfer phase the charge stored on the first capacitor is transferred to a second capacitor using the charge pump.

In an embodiment a method for reducing an error due to circuit delay in comparator based switch capacitor (CBSC) circuit is disclosed, the CBSC circuit comprising a comparator, a charge pump controlled by the comparator, and a plurality of capacitors, the method comprising: deliberately introducing an offset to the comparator to cancel the error.

BRIEF DESCRIPTION OF THE DRAWINGS

The subject matter regarded as the invention is particularly pointed out and distinctly claimed in the concluding portion of the specification. The invention, both as to device and method of operation, together with features and advantages thereof may best be understood by reference to the following detailed description with the accompanying drawings in which:

DETAILED DESCRIPTION OF THIS INVENTION

The present invention relates to self-calibrating comparator based switch capacitor (CBSC) circuit. While the specifications describe several example embodiments of the invention considered best modes of practicing the invention, it should be understood that the invention can be implemented in many ways and is not limited to the particular examples described below or to the particular manner in which any features of such examples are implemented.

The present invention is general and applicable to any sampled-data analog circuit. For example, the present invention can be applied to a pipeline ADC (analog-digital converter), and also to a delta-sigma ADC. A sampled-data analog circuit usually works in a multi-phase manner. By way of example but not limitation, a two-phase switch-capacitor circuit in accordance with the present invention is disclosed. Like the prior art described earlier, the two phases are sampling phase ($\phi_1$) and transfer phase ($\phi_2$). During the sampling phase ($\phi_1$), an input signal is sampled and stored by an input capacitor. During the transfer phase ($\phi_2$), the charge stored on the input capacitor is transferred to a feedback capacitor by injecting/draining current into/from the feedback capacitor connected in series with the input capacitor using the charge pump. A comparator is used to determine if the charge stored on the input capacitor has been completely transferred to the feedback capacitor. The charge pump circuit is turned off and consequently the charge transfer is stopped upon detecting the charge transfer is complete. As explained earlier, there is an error on the charge transfer due to circuit delay. Unlike the prior art CBSC circuit, an offset voltage is deliberately applied to the comparator to reduce the error due to circuit delay.

Figure 1:
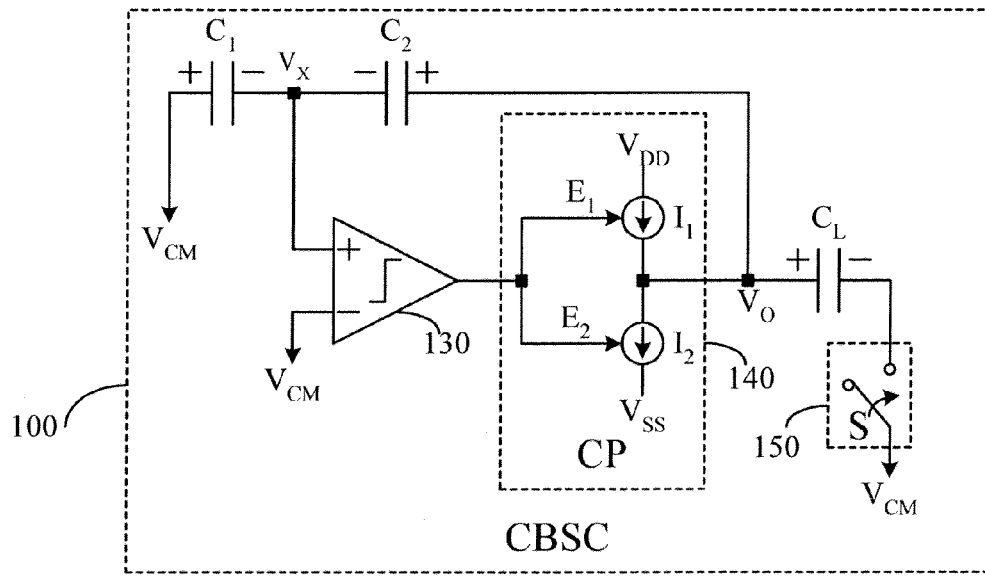
FIG. 1 depicts a prior art comparator based switch capacitor (CBSC) circuit during transfer phase.
Figure 2:
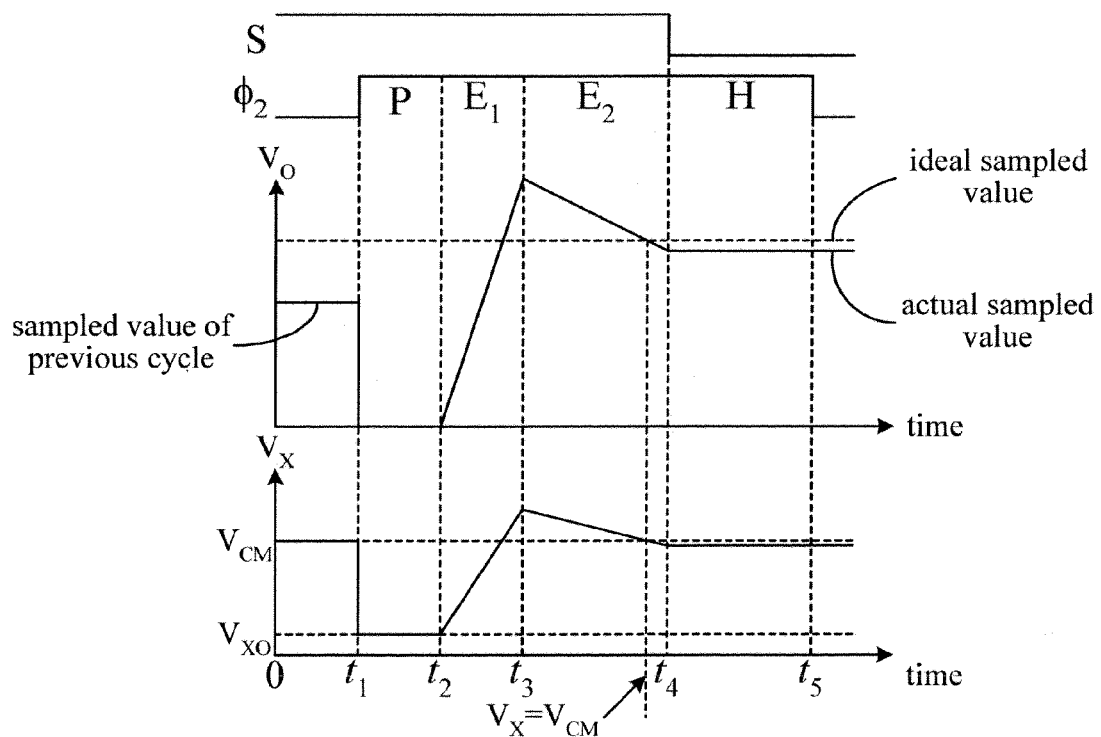
FIG. 2 depicts a typical timing diagram for the CBSC circuit depicted in FIG. 1.
Figure 3:
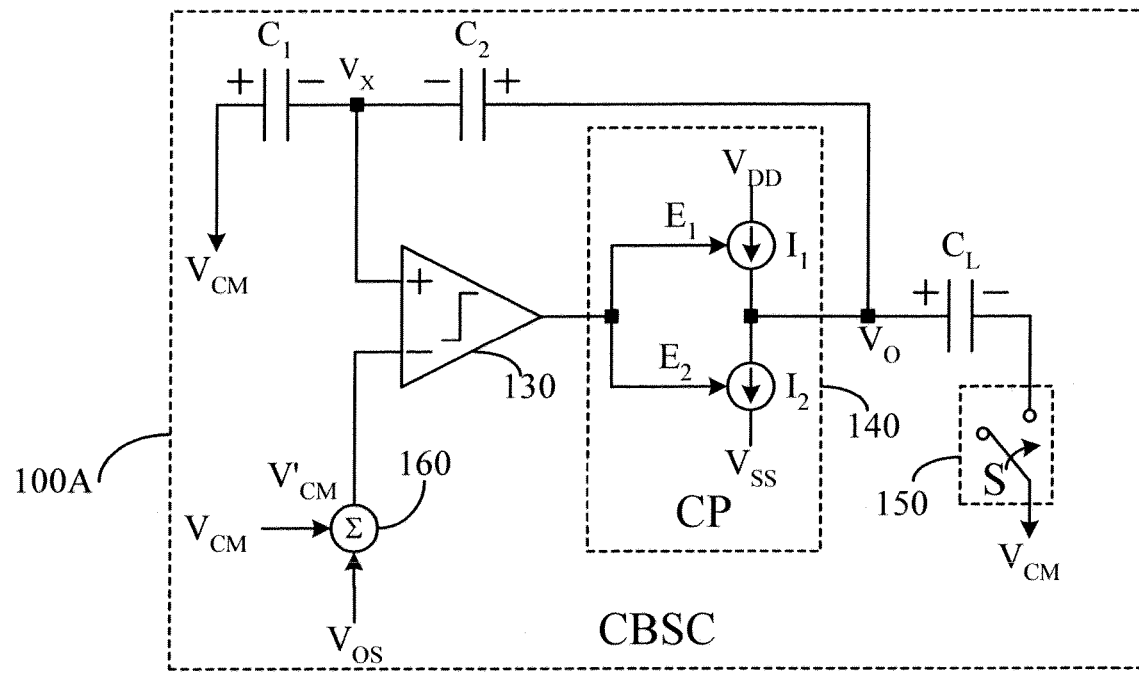
FIG. 3 depicts an embodiment of CBSC circuit that deliberately includes an offset voltage to the comparator.

FIG. 3 depicts a CBSC circuit 100A during the charge transfer phase ($\phi_2$) in accordance with the present invention. Here, CBSC circuit 100A is exactly the same as the prior art CBSC circuit 100 except that the reference voltage $V_{CM}$ for the comparator 130 is replaced by $V'_{CM}$, which is obtained by applying an offset voltage $V_{OS}$ added to $V_{CM}$ using a summing circuit 340. By properly setting the value of the offset voltage $V_{OS}$, we can completely remove the error on the final sampled value of $V_O$ due to circuit delay.

Let the error on the final sampled value of $V_O$ be $\epsilon$ in the absence of the offset voltage (i.e. when $V_{OS}=0$). This error is defined as the difference between the final sampled value of $V_O$ and the ideal sampled value in the absence of circuit delay. For the CBSC circuit 100A, as explained earlier, $\epsilon$ is always negative due to the circuit delay. In the presence of the offset voltage $V_{OS}$, an additional error term is introduced to the final sampled value $V_O$. Based on conservation of charge, we know that the value of the additional error term is:

$$\epsilon' = V_{OS} \cdot C_1/C_2.$$

This additional error term can complete cancel with the error $\epsilon$ if $V_{OS}$ is chosen such that:

$$V_{OS} = -\epsilon \cdot C_2/C_1$$

Therefore, we can completely neutralize the error on the final sampled value of $V_O$ by deliberately and properly introducing a voltage offset to the comparator.

Although in FIG. 3 the offset voltage $V_{OS}$ is added to $V_{CM}$ by using an explicit summing circuit 340, in practice the offset voltage can be implicitly realized without using an explicit summing circuit. For instance, a comparator can be implemented using a high-gain differential pair comprising two input transistors. A mismatch between the two input transistors effectively introduces an offset to the comparator. Therefore, the offset voltage $V_{OS}$ can be implicitly realized by deliberately using a mismatched differential pair with a proper amount of mismatch. The analysis on the relation between CMOS transistor mismatch and the effective offset voltage is well done in prior art and can be found, for instance, in Chapter 13 of *Design of Analog CMOS Integrated Circuits* authored by Behzad Razavi and published by McGraw-Hill in 2001.

In an embodiment, the value of the offset voltage $V_{OS}$ is predetermined based on estimating the circuit delay and accordingly its effect on the error of the final sampled value of $V_O$. In practice, the error caused by the circuit delay cannot be accurately estimated due to various reasons, e.g. temperature drift and manufacturing process variation. Therefore, the error of the final sampled value of $V_O$ can be reduced but not possibly completely removed if we set the value of the offset voltage $V_{OS}$ simply based on estimation.

In an embodiment, the value of the offset voltage $V_{OS}$ is chosen among a set of predetermined values so as to minimize the error on the final sampled value of $V_O$.

In an embodiment, the value of the offset voltage $V_{OS}$ is chosen among a set of predetermined values using a calibration circuit activated during a calibration period, which is at system start-up or intermission where the system is not in an active state, i.e. there is no input signal to be sampled. During the calibration period, the CBSC circuit 100A of FIG. 3 still cyclically works in a two-phase method. During every sampling phase of the calibration period, all capacitors ($C_1$, $C_2$, and $C_L$ in FIG. 3) are reset (i.e. cleared of charge). At the end of every transfer phase, ideally there should be no charge on the load capacitor $C_L$ and the final sampled value of $V_O$ should be the same as the common-mode voltage $V_{CM}$. If the final sampled value of $V_O$ is lower than $V_{CM}$ (i.e. $\epsilon<0$), we need to increase the value of the offset voltage $V_{OS}$ to offset the error. If the final sampled value of $V_O$ is greater than $V_{CM}$ (i.e. $\epsilon>0$), we need to decrease the value of the offset voltage $V_{OS}$ to offset the error. In this manner, we iteratively adjust the value of the offset voltage $V_{OS}$ so as to minimize the error on the final sampled value of $V_O$.

Figure 4:
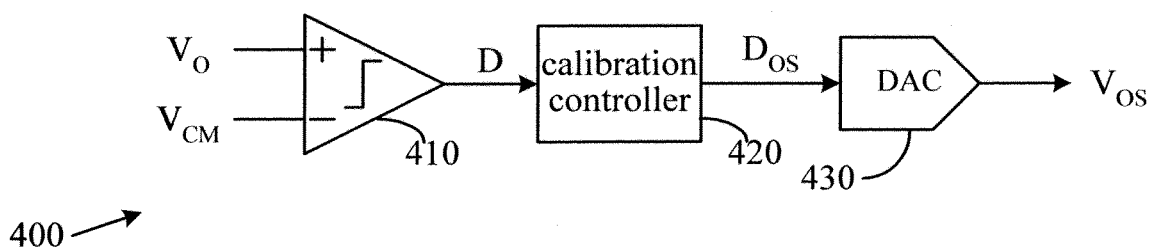
FIG. 4 depicts an embodiment of a calibration circuit for generating the offset voltage for the CBSC circuit of FIG. 3.
Figure 5:
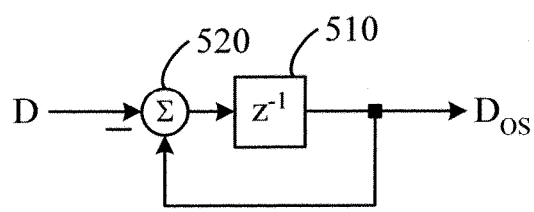
FIG. 5 depicts an embodiment of the calibration controller of the calibration circuit of FIG. 4.

FIG. 4 depicts an exemplary calibration circuit 400 comprising: a comparator 410 for comparing the final sampled value of $V_O$ with $V_{CM}$, resulting a binary decision D; a calibration controller 420 receiving the decision D and generating a digital control word $D_{OS}$; and a digital-to-analog converter for converting the digital control word $D_{OS}$ into the offset voltage $V_{OS}$. The decision D is either 1 (when $V_O>V_{CM}$) or -1 (when $V_O<V_{CM}$). In an embodiment depicted in FIG. 5, the valued of the digital control word $D_{OS}$ is incremented when D=-1 and decremented when D=1, using a calibration controller comprising a unit-delay circuit 510 and an adder 520. In an embodiment, the offset voltage $V_{OS}$ is implicitly realized using a mismatch in a differential pair of the comparator of the core CBSC circuit to be calibrated. In an embodiment, the differential pair of the comparator of the core CBSC circuit to be calibrated has many configurations each having a distinct mismatch, and DAC 430 is implicitly realized by selecting one among said configurations.

In systems where the output signal needs to have a zero mean in the absence of circuit non-ideality, we can choose to calibrate the offset even when the system is in an active state; in other words, the calibration can be performed even when the CBSC circuit is receiving signal. Since the output signal needs to have a zero mean, we can continually adjust the offset voltage to make the output signal have a zero mean. The calibration circuit of FIG. 4 can be used, but we prefer to insert a low-pass filter circuit (no shown in the figure) to filter the decision D from comparator 410 to smoothen the adaptation of the offset voltage.

Figure 6:
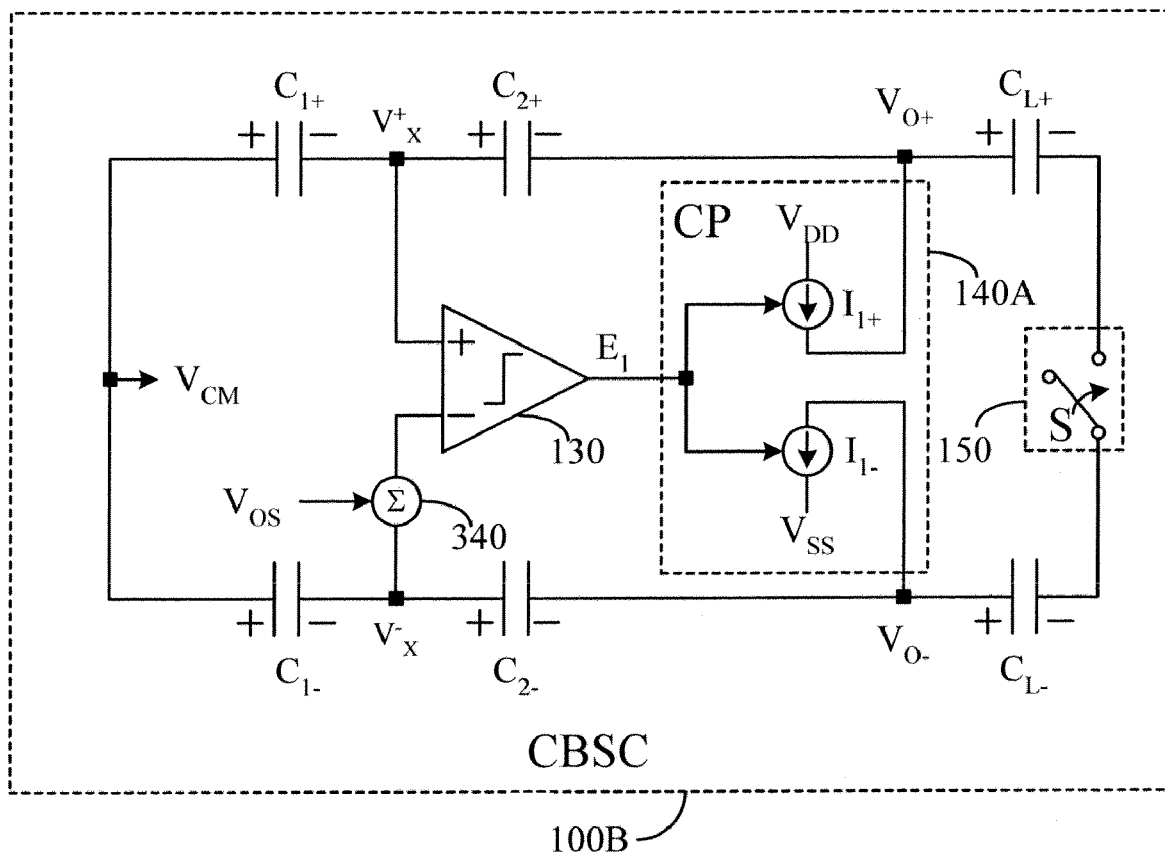
FIG. 6 depicts a differential circuit implementation of the CBSC circuit of FIG. 3.

For those of ordinary skill in the art, the principle disclosed by the present invention can be practiced in various alternative forms, including the following:

1. In an embodiment, one may pull the output voltage $V_O$ to $V_{DD}$, the highest potential of the system, during the preset (P) phase, thus forcing the condition $V_X > V_{CM}$ before entering the coarse transfer phase ($E_1$). In that scenario, $I_1$ needs to be changed to a current sink while $I_2$ needs to be changed to a current source.
2. In an embodiment, one may totally eliminate the fine transfer phases $E_2$, as the error due to circuit delay can be cancelled out anyway using the offset voltage. In this case, the $I_2$ current is eliminated, and the overall operation speed of the switch capacitor circuit improves. Also, the polarity of the offset voltage $V_{OS}$ needs to be reversed since the polarity of the error on the final sampled value of $V_O$ due to circuit delay is reversed.
3. In an embodiment, one may use a differential circuit instead of a single-ended circuit to implement the core CBSC circuit and also the calibration circuit. A differential core CBSC circuit comprises: a pair of input capacitors $C_{1+}$ and $C_{1-}$; a pair of feedback capacitors $C_{2+}$ and $C_{2-}$; a pair of load capacitors $C_{2+}$ and $C_{2-}$; a comparator; and a charge pump circuit. During the sampling phase, the input capacitor pair C1+ and C1− samples a differential voltage. During the transfer phase, the differential voltage sampled by the input capacitor pair C1+ and C1− is transferred to the feedback capacitor pair $C_{2+}$ and $C_{2-}$. FIG. 6 depicts an exemplary circuit 100B that is a differential counterpart to the single-ended circuit 100A depicted in FIG. 3 during the transfer phase. Note that although the fine transfer phase $E_2$ is eliminated in CP 140A of FIG. 6, for those of ordinary skill in the art it is straightforward to include the fine transfer phase by adding a current source $I_{2+}$ and a current sink $I_{2-}$ that are both controlled by $E_2$. In a differential circuit configuration, comparator 410 of the calibration circuit 400 (see FIG. 4) needs to compare $V_{O+}$ with $V_{O-}$, instead of comparing $V_O$ with $V_{CM}$.
4. In an embodiment, during the transfer phases, the "+" end of capacitor $C_1$ in FIG. 3 may be connected to a voltage different from $V_{CM}$. For example, for a pipeline ADC application, the "+" end of capacitor $C_1$ may be connected to one of many other predefined voltages depending on the range of the input voltage sampled during the sampling phase. The principle taught by the present invention, however, applies equally well to that scenario.
5. In a further embodiment, the capacitor $C_1$ is implemented using a plurality of capacitors, which are connected in parallel during the sampling phase but during the transfer phase their "+" ends may be connected to different voltages, each chosen from either among many predefined voltages or connected to an internal node within the system. The principle taught by the present invention, however, applies equally well to that scenario.

Also, there are many switches (besides switch 150) that are needed but not displayed in any of the figures. They are controlled by a plurality of clock signals to define the circuit configuration (i.e. the connections among circuit elements) for both sampling phase ($\phi_1$) and the transfer phase ($\phi_2$). They are not shown in the figures because they are implied and deemed obvious to those of ordinary skill in the art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A comparator based switch capacitor (CBSC) circuit comprising a comparator with a substantial amount of offset, a charge pump controlled by an output of the comparator, and a plurality of capacitors, wherein:

during a sampling phase the CBSC circuit samples an input voltage using a first capacitor, and during a transfer phase the charge stored on the first capacitor is transferred to a second capacitor by injecting or draining charge using the charge pump;

wherein the amount of offset is determined by a calibration circuit of the CBSC circuit activated during a calibration period.

2. The circuit of claim 1, wherein during the transfer phase the comparator compares a voltage on the first capacitor with a voltage at a node of the CBSC circuit.

3. The circuit of claim 1, wherein during the transfer phase the charge pump is turned on initially.

4. The circuit of claim 3, wherein during the transfer phase the charge pump is turned off upon detecting a toggle of an output of the comparator.

5. The circuit of claim 1, wherein the amount of offset is predetermined.

6. The circuit of claim 1, wherein the amount of offset is chosen among a set of pre-defined values.

7. The circuit of claim 1, wherein the calibration circuit comprises a second comparator, and a calibration controller, which controls the amount of offset based on decisions from the second comparator.

8. The circuit of claim 7, wherein the second comparator compares an output of the CBSC circuit with a voltage at a node of the CBSC circuit.

9. The circuit of claim 8, wherein the calibration controller increments the amount of offset when the second comparator output is of a first value, and decrements the amount of offset when the second comparator output is of a second value.

10. A method of reducing an error due to circuit delay in a comparator based switch capacitor (CBSC) circuit comprising a comparator, a charge pump controlled by an output of the comparator, and a plurality of capacitors, the method comprising:

deliberately introducing an offset to the comparator;

sampling an input voltage using a first capacitor in a sampling phase; and transferring the charge stored on the first capacitor to a second capacitor by injecting or draining charge using the charge pump in a transfer phase;

wherein the amount of offset is determined by a calibration circuit of the CBSC circuit activated during a calibration period.

11. The method of claim 10, wherein during a sampling phase a first capacitor samples an input voltage and during a transfer phase the comparator compares a voltage on the first capacitor with a voltage at a node of the CBSC circuit.

12. The method of claim 11, wherein during the transfer phase the charge pump is turned on initially to facilitate transferring the charge stored on the first capacitor to a second capacitor.

13. The method of claim 12, wherein during the transfer phase the charge pump is turned off upon detecting a toggle of an output of the comparator.

14. The method of claim 10, wherein the amount of offset is predetermined.

15. The method of claim 10, wherein the amount of offset is chosen among a set of pre-defined values.

16. The method of claim 10, wherein the calibration circuit comprises a second comparator, and a calibration controller, which controls the amount of offset based on decisions from the second comparator.

17. The method of claim 16, wherein the second comparator compares an output of the CBSC circuit with a voltage at a node of the CBSC circuit.

18. The method of claim 17, wherein the calibration controller increments the amount of offset when the second comparator output is of a first value, and decrements the amount of offset when the second comparator output is of a second value.

* * * * *